(12) United States Patent
Suchoff

(10) Patent No.: US 9,482,698 B2
(45) Date of Patent: Nov. 1, 2016

(54) METHODS AND APPARATUS FOR RESISTIVE VOLTAGE SENSING IN AN ISOLATED POWER DISTRIBUTION UNIT

(75) Inventor: Michael Suchoff, Chapel Hill, NC (US)

(73) Assignee: Raritan Americas, Inc., Somerset, NJ (US)

( * ) Notice: Subject to any disclaimer, the term of this patent is extended or adjusted under 35 U.S.C. 154(b) by 289 days.

(21) Appl. No.: 12/899,656

(22) Filed: Oct. 7, 2010

(65) Prior Publication Data

US 2012/0086425 A1    Apr. 12, 2012

(51) Int. Cl.
| | |
|---|---|
| *G01R 15/09* | (2006.01) |
| *G01R 15/04* | (2006.01) |
| *H02H 9/06* | (2006.01) |
| *H02H 9/04* | (2006.01) |
| *G01R 19/00* | (2006.01) |

(52) U.S. Cl.
CPC .......... *G01R 15/04* (2013.01); *G01R 19/0084* (2013.01); *H02H 9/04* (2013.01); *H02H 9/06* (2013.01)

(58) Field of Classification Search
CPC ... G01R 15/04; G01R 19/0084; H02H 9/008
USPC ................. 324/691, 693, 705, 713
See application file for complete search history.

(56) References Cited

U.S. PATENT DOCUMENTS

| | | | |
|---|---|---|---|
| 6,861,843 B2 * | 3/2005 | Muldoon ...................... 324/439 |
| 7,755,400 B2 * | 7/2010 | Jordanger et al. ............ 327/142 |
| 7,760,477 B1 * | 7/2010 | Watt et al. ...................... 361/56 |
| 2002/0080545 A1 * | 6/2002 | Slater ..................... H02H 9/042 361/106 |
| 2004/0090724 A1 * | 5/2004 | Bax ........................ H02H 3/347 361/42 |
| 2004/0090727 A1 * | 5/2004 | Smith et al. ................. 361/93.9 |
| 2009/0039855 A1 * | 2/2009 | D'Souza et al. .............. 323/285 |

OTHER PUBLICATIONS

UL Standard for Safety for Information Technology Equipment, UL 60950, Third Edition, Dec. 1, 2000, Underwriters Labarotaroies Inc.*

* cited by examiner

*Primary Examiner* — Jermele M Hollington
*Assistant Examiner* — Dustin Dickinson
(74) *Attorney, Agent, or Firm* — Vorys, Sater, Seymour and Pease LLP; Vincent M DeLuca

(57) ABSTRACT

Methods and apparatus provide for a primary side circuit including one or more voltage nodes; and a monitoring circuit operating to monitor one or more parameters of the primary side circuit, and including at least one sensing circuit and at least one processing circuit within a secondary side circuit, where the sensing circuit includes a resistor network having an input for receiving a first sensed voltage from a first of the voltage nodes of the primary side circuit, traversing an isolation boundary between the primary side circuit and the secondary side circuit while adhering to a safety specification, which includes a primary-secondary isolation requirement, and having an output for providing a first modified sensed voltage to the processing circuit.

13 Claims, 7 Drawing Sheets

METHODS AND APPARATUS FOR RESISTIVE VOLTAGE SENSING IN AN ISOLATED POWER DISTRIBUTION UNIT

BACKGROUND

The invention relates to voltage sensors, and more particularly relates to voltage sensors that measure AC mains voltage and output to a circuit that is safe for an operator to touch (SELV circuit). In one or more specific applications, the invention relates to highly accurate, inexpensive, and physically small voltage sensors for use in devices that are UL 60950-1 compliant, and to UL 60950-1 compliant devices that use such sensors. The following description focuses upon use of the invention in a specific context, namely a UL 60950-1 compliant power distribution unit ("PDU") but the invention is not limited to PDU applications and can be used in other applications where UL 60950-1 compliance or other safety standards are necessary or commercially advantageous.

The UL 60950-1 standard establishes requirements that reduce risks to persons who operate and service information technology equipment ("IT equipment"). Examples of IT equipment are data and text processing machines, data network equipment, such as routers, telecom switches, servers, modems, and PDUs (discussed in more detail below), but IT equipment is intended to be interpreted in the broadest sense and is not limited to these specifically enumerated devices or to PDUs in particular.

IT equipment typically derives power from the AC mains supply ("primary") and contains input/output interfaces ("I/O") that interconnect with other IT equipment. UL 60950-1 requires user accessible I/O to be safe to touch. A safe to touch circuit is defined by UL 60950-1 as a "secondary extra low voltage" circuit ("SELV"). According to UL 60950-1, a SELV circuit must satisfy these requirements: (a) has no direct connection to a primary and derives its power from a transformer, converter or equivalent isolation device, (b) is limited to 42.4 V peak, and (c) insures that requirements (a) and (b) are met under normal operating conditions and single fault conditions.

IT equipment rooms (also known as data centers) utilize hundreds or even thousands of units of IT equipment. Each piece of IT equipment receives primary power by plugging into an outlet of a power distribution unit ("PDU"). A PDU is also a piece of IT equipment and it typically includes: (a) a high power inlet from which it receives power (typically from a panel board), (b) multiple lower power outlets, and (optionally) (c) circuit breakers or fuses to protect the outlets from over current conditions (short circuits, etc.).

PDUs designed for IT equipment rooms advantageously perform functions additional to power distribution. For example, intelligent PDUs can report certain status information over a communication and/or input/output interface, including: (a) the voltage being supplied to the PDU's inlet, (b) how much power (power=voltage times current) is flowing in the inlet and each outlet, and (c) the trip state (whether voltage is present) of each circuit breaker. Since gathering the above status information relies on sensing voltage, an IT equipment room with thousands of units of IT equipment will therefore require thousands of such voltage sensors. It will therefore be evident that requirements for such voltage sensors should include: (a) the ability to measure a primary voltage and output to a SELV circuit, (b) highly accurate output, (c) low cost, and (d) small size.

Conventionally, voltage sensors able to measure voltage in a primary circuit and output the measurement to a SELV circuit have been built using transformers, opto-coupler devices, Hall effect devices, etc. These devices are used in order to meet the primary to secondary isolation requirements of a SELV circuit (which are, again, established by the particular standard at issue, such as UL 60950-1). However, these devices do not make highly accurate sensors, and are expensive and large in size.

Reference is made to FIGS. 1 and 2, which schematically illustrate a safety compliant power distribution unit (PDU), including conventional voltage sensors to achieve primary to secondary isolation. The system includes a power distribution unit (PDU) (2), which receives primary AC mains power from an inlet (1). A measurement of the voltage and power at the inlet (1) is made using one or more voltage sensors (5). Primary voltage from the inlet (1) is wired to the inputs of one or more circuit breakers (3) (if any), or other over-current protectors, such as fuses (not shown). The purpose of each circuit breaker (3) is to limit the electrical current flowing in the associated outlet receptacles (4) by switching off voltage (interrupting the current path) when the current flowing through the given circuit breaker (3) exceeds its rating. The on/off ("trip") state of a given one or more of the circuit breakers (3) can be detected using one or more voltage sensors (6) to sense presence of primary voltage at the output of the circuit breaker (3). Primary voltage from the output of each circuit breaker (3) is wired to one or more outlet receptacles (4). A unit of IT equipment (8) can receive power from the PDU (2) by connecting an inlet plug (9) of the IT equipment (8) into one of the outlet receptacles (4) of the PDU (2). A measurement of the voltage at the outlet receptacle (4), and power drawn by the IT equipment (8), is made using one or more voltage sensors (7).

Conventional voltage sensors that may be used to perform the voltage and power measurements in FIG. 1 are shown in FIG. 2. The voltage and power of the inlet (1) is shown being measured using a SELV circuit (8) that uses a step down transformer voltage sensor (6) and a current sensor (7) to compute power using the well known electric power formula (power =voltage times current). The step-down transformer (6) meets the isolation requirements of a SELV circuit by using a magnetic field to isolate its input connection to the primary side lines (2a and 2c) from its output (6a) connection to the SELV circuit (8). The voltage requirements of a SELV circuit are met by using a winding ratio that reduces its output (6a) voltage to less than 42.4V peak. In addition, a fuse (9a) is usually included to prevent a short circuit in the event of a fault in the step down transformer voltage sensor (6).

Disadvantages of the step down transformer (6) include its large size, high cost and significant inaccuracies. The step down transformer (6) is large and expensive because of a number of turns of magnet wire required to handle the high voltage and low frequency of the primary AC voltage. The step down transformer (6) is inaccurate because its magnetic inductive coupling results in output amplitude and phase shift variance between different transformers of the same make and model number.

The on/off state of each circuit breaker (3) is monitored with a separate SELV circuit (12). The SELV circuit (12) uses an optical isolator (10) as a voltage sensor and this meets the isolation requirements of a SELV circuit by using light to isolate its input (10a) connection to the primary side lines (2b and 2c) from its output (10b) connection to the secondary side SELV circuit (12). The light emitting diode ("LED") (10a) of the optical isolator (10) is wired in series with a current limit resistor (11) and these two devices are then wired across the primary output (2b) of the circuit breaker (3) and the primary line (2c). When the circuit breaker (3) is closed and in the normal operating state, the LED (10a) turns on and off once every primary AC voltage cycle. When the LED (10a) is on, it emits photons which turn on the transistor (10b) of the optical isolator (10). When the circuit breaker (3) is open ("tripped"), no LED (10a) current flows and the transistor (10b) remains turned off. The SELV circuit (12) detects whether or not the transistor (10b) is turning on and off as an indication of the trip state of the circuit breaker (3).

Among the disadvantages of the optical isolator (10) is the relatively large power required to turn on its LED (10a). For example, an LED requiring 1 mA of current would require 0.250 watts when used to measure a 250V primary AC mains line. Optical isolators are also inherently inaccurate, especially over temperature, and are relatively unreliable as compared with, for example, a simple resistor network.

The voltage and power of each outlet receptacle (5) in FIG. 2 is measured using a primary powered measurement circuit (13) that uses a resistor voltage sensor (12) and current sensor (7). However, because the resistor voltage sensor (12) is not isolated from the primary side AC power (2b), the primary circuit (13) requires isolation circuitry (14), such as an optical isolator or other type of circuit, to connect it to the SELV circuitry (15).

The disadvantages of the primary powered resistive sensor measurement circuit (13) combined with the isolation circuitry (14) are, again, its cost, complexity, accuracy and/or reliability issues.

Although resistor sensors are known to exhibit inherent linearity, high accuracy, low cost and small size, such sensors have not been used to provide sensed voltages across isolation boundaries in circuits requiring isolation from primary to secondary (such as SELV circuits). Indeed, the accepted wisdom in the circuit design arts is exactly opposite; namely, to avoid resistive sensing networks in such applications. Such accepted wisdom has been developed over years and years of ingrained group-thinking (which has been passed from master to apprentice) that the use of resistive networks would fail to meet safety/isolation standards, such as those required by UL 60950-1. Consequently, there are no known circuits in the prior art employing resistive networks to provide sensed voltages across isolation boundaries. Moreover, owing to the accepted wisdom in this art area, skilled artisans are not motivated to use resistive networks in such applications. Thus, a long felt, but unsatisfied, need has developed in this area of circuit design, which has been simply accepted by those skilled in the art.

SUMMARY OF THE INVENTION

Again, in one or more specific embodiments, the invention may provide a highly accurate, inexpensive, and physically small voltage sensor to provide sensed voltages across an isolation boundary in a circuit requiring isolation from primary to secondary (such as set forth in UL 60950-1). It bears repeating, however, that it is contemplated that the invention may be embodied in any number of circuits, systems, devices, etc. where UL 60950-1 compliance or other safety standards are necessary or desired.

One or more aspects of the invention proceed from the entirely unexpected discovery that a voltage sensor, if properly designed using a plurality of resistors configured as a voltage divider, can satisfy known safety/isolation requirements (such as the UL 60950-1 SELV requirements). In this regard, it has been discovered that a voltage sensor designed using a plurality of resistors in a particular way can satisfy at least the following additional safety/isolation requirements:

1. The voltage sensor resistors may connect between one or more nodes on the primary side and one or more nodes of the secondary side (e.g., the SELV) provided that minimum clearance and creepage spacing requirements are met (for example the requirements set forth in UL 60950-1 section 1.5.7). This requirement may be satisfied, for example, by constructing the voltage sensor resistors on a printed circuit board where the distance between components meets the desired clearance and spacing values.

2. Under normal operating conditions, or when any single component (in this case resistors) in the sensor fails due to an open or short circuit, the current flow from the primary side circuit to the secondary side circuit (e.g., SELV circuit) must be less than a specified threshold level (e.g., 700 microamperes peak as specified in UL 60950-1 sections 1.5.7 and 2.4). This requirement may be satisfied by using a plurality of resistors wired in series, each of sufficiently high resistance such that if any one of the resistors is shorted or opened, the resulting current flow from the primary side circuit to the secondary side circuit is less than the threshold level, e.g., 700 microamperes peak.

3. The resistors must not break down or short when subjected to a high voltage applied to the highest potential source in the primary side circuit (the so-called hipot). By way of example, a hipot is specified in UL 60950-1 section 5.2. This requirement may be satisfied by choosing resistors with sufficiently high working voltages.

4. The voltage one any node of the secondary side circuit (e.g., the SELV circuit) may not exceed a particular threshold level (e.g., 42.4V peak as specified in UL 60950-1 section 2.2). This requirement may be met by choosing the ratio-metric values of the resistors in the voltage divider to limit the SELV voltage to the threshold level, e.g., 42.4V peak.

In accordance with one or more aspects of the present invention, an apparatus includes: a primary side circuit including one or more voltage nodes; and a monitoring circuit operating to monitor one or more parameters of the primary side circuit, and including at least one sensing circuit and at least one processing circuit within a secondary side circuit. The sensing circuit may include a resistor network having an input for receiving a first sensed voltage from a first of the voltage nodes of the primary side circuit, traversing an isolation boundary between the primary side circuit and the secondary side circuit while adhering to a safety specification, which includes a primary-secondary isolation requirement, and having an output for providing a first modified sensed voltage to the processing circuit.

The resistor network preferably includes: a plurality of series-coupled resistors, which are connected at one end to the first voltage node of the primary side circuit, and are connected at an opposite end to a junction node; and a shunt resistance coupled from the junction node to a reference potential. The output providing the first modified sensed voltage to the processing circuit is at least one of taken from, and derived from, a voltage at the junction node.

In accordance with one or more embodiments, the first voltage node of the primary side circuit exhibits a single ended voltage potential with respect to the reference potential; and the output providing the first modified sensed voltage to the processing circuit is a single ended voltage taken from the junction node with respect to the reference potential.

In accordance with one or more further embodiments, the first voltage node of the primary side circuit exhibits a single ended alternating current (AC) voltage potential with respect to the reference potential; the apparatus further includes a switching circuit including an input terminal coupled to the junction node and an output terminal, which pulses in response to the AC potential at the input terminal; and the output providing the first modified sensed voltage to the processing circuit is a single ended pulsed voltage taken from the output terminal of the switching circuit with respect to the reference potential. The single ended pulsed voltage indicates the presence or absence of the AC voltage potential of the primary side circuit.

The switching circuit may include a switching transistor having an input terminal and two output terminals; the input terminal of the switching transistor is the input terminal of the switching circuit; one of the output terminals of the switching transistor is held at a bias voltage potential; the single ended pulsed voltage is taken from the other of the output terminals of the switching transistor with respect to the reference potential. For example, the switching transistor may be a bipolar junction transistor, having a base as an input terminal, an emitter coupled to the reference potential and a collector from which the single ended pulsed voltage is taken.

In accordance with one or more further embodiments of the present invention: first and second voltage nodes of the primary side circuit produce a differential voltage; the plurality of series-coupled resistors includes first and second pluralities of series-coupled resistors; the first plurality of series-coupled resistors are connected at one end to the first voltage node of the primary side circuit, and are connected at an opposite end to a first junction node; and the second plurality of series-coupled resistors are connected at one end to the second voltage node of the primary side circuit, and are connected at an opposite end to a second junction node.

In accordance with some aspects, the shunt resistance may include first and second resistances, the first resistance coupled from the first junction node to the reference potential, and the second resistance coupled from the second junction node to the reference potential; and the output providing the first modified sensed voltage to the processing circuit may be taken as a differential output between the first and second junction nodes.

In accordance with alternative or additional aspects, the apparatus further comprises a differential to single ended conversion circuit having first and second input terminals and an output terminal; the shunt resistance includes first and second resistances; the first resistance is coupled from the first junction node to a first potential, and the first junction node is coupled to the first input terminal of the differential to single ended conversion circuit; the second resistance is coupled from the second junction node to a second potential, and the second junction node is coupled to the second input terminal of the differential to single ended conversion circuit; and the output providing the first modified sensed voltage to the processing circuit is taken as a single ended output at the output terminal of the differential to single ended conversion circuit with respect to the reference potential.

The differential to single ended conversion circuit may include an operational amplifier having first and second input terminals and an output terminal, which are the first, second and output terminals of the differential to single ended conversion circuit, respectively; the first potential is at a voltage potential above the reference potential; the second resistance is coupled from the second junction node to the output terminal of the operational amplifier; and the single ended output is taken at the output of the operational amplifier with respect to the reference potential.

In accordance with one or more further aspects of the present invention, the one or more voltage nodes of the primary side circuit are coupled to a source of power and the monitoring circuit operates to monitor one or more parameters of the source of power.

In accordance with one or more further aspects of the present invention, the sensing circuit does not employ any optical devices, transformer devices, and/or Hall effect devices in traversing the boundary from the first sensed voltage to the first modified sensed voltage.

Other aspects, features, and advantages of the present invention will be apparent to one skilled in the art from the description herein taken in conjunction with the accompanying drawings.

BRIEF DESCRIPTION OF THE DRAWINGS

Exemplary and non-limiting embodiments of the invention are illustrated in the Figures. The drawings may not be to scale, various details may be enlarged or reduced for clarity, and the illustrate values of any electrical components are merely exemplary and not limiting.

DETAILED DESCRIPTION OF PREFERRED EMBODIMENTS

Although one or more embodiments of the invention may be designed for use in a PDU intended for IT equipment applications, and is here illustrated as used in such a PDU, this is not required. Various aspects of the invention are suitable for use in any application requiring an inexpensive, accurate, small and low power consumption voltage (or current) sensor that measures the voltage or current of a primary side source and outputs the measured value(s)

across an isolation boundary to a secondary side circuit, such as a UL 60950-1 compliant SELV circuit.

Figure 3:
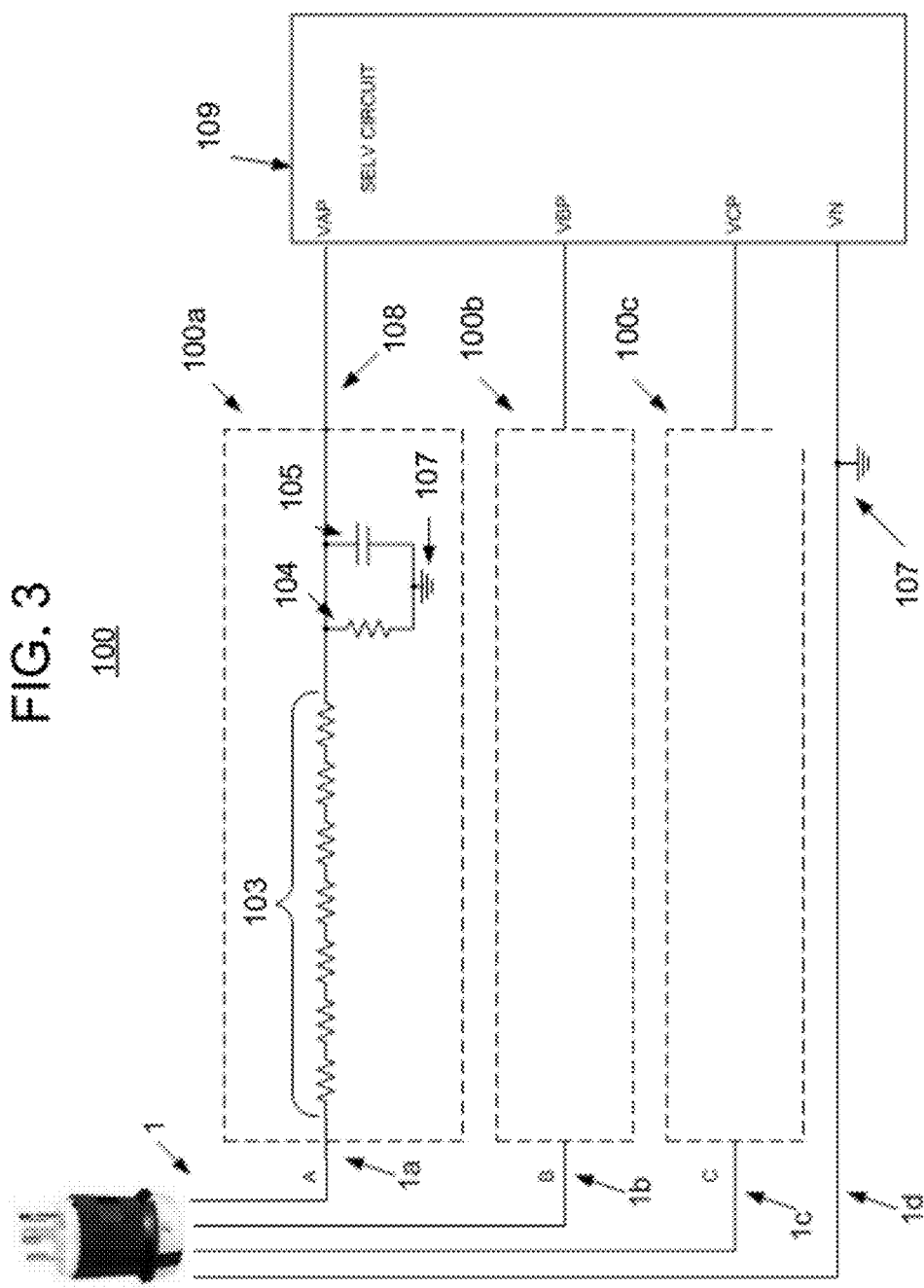
FIG. 3 schematically illustrates a preferred embodiment of the invention for a voltage sensor with a single ended primary side sensed input and a single ended output for connection to a secondary side circuit.

FIG. 3 illustrates a preferred embodiment of the invention in a system 100, that includes a voltage sensor that performs a single ended measurement between a primary side AC main line (1) and ground (107) and outputs a scaled down AC voltage single ended SELV output (108). A single ended input, single ended output sensor is useful when measuring a primary 4-wire 3-phase AC power line (1), which includes lines (1a, 1b, 1c, 1d) using a SELV circuit (109) that incorporates single ended analog to digital converters. By way of example, the Analog Devices ADE7878 Energy Metering IC may be used as the SELV 109. Three identical voltage sensors (100a, 100b, 100c) may be used, and thus only a detailed description of voltage sensor 100a is described in the following paragraphs.

Figure 1:
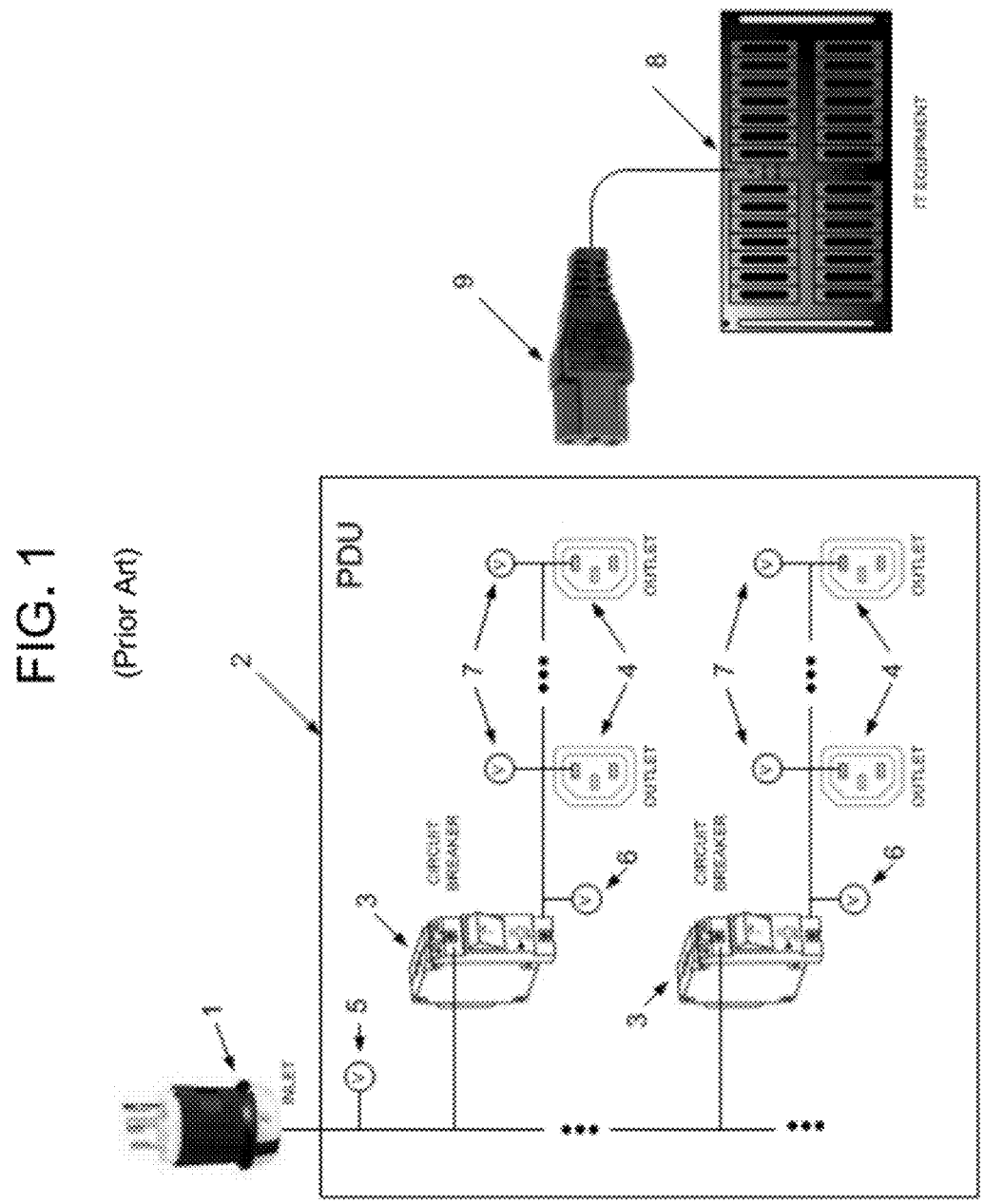
FIG. 1 schematically illustrates a safety compliant power distribution unit (PDU) consisting of an inlet, outlets, circuit breakers and voltage sensors for measuring power and detecting circuit breaker open/close state.
Figure 2:
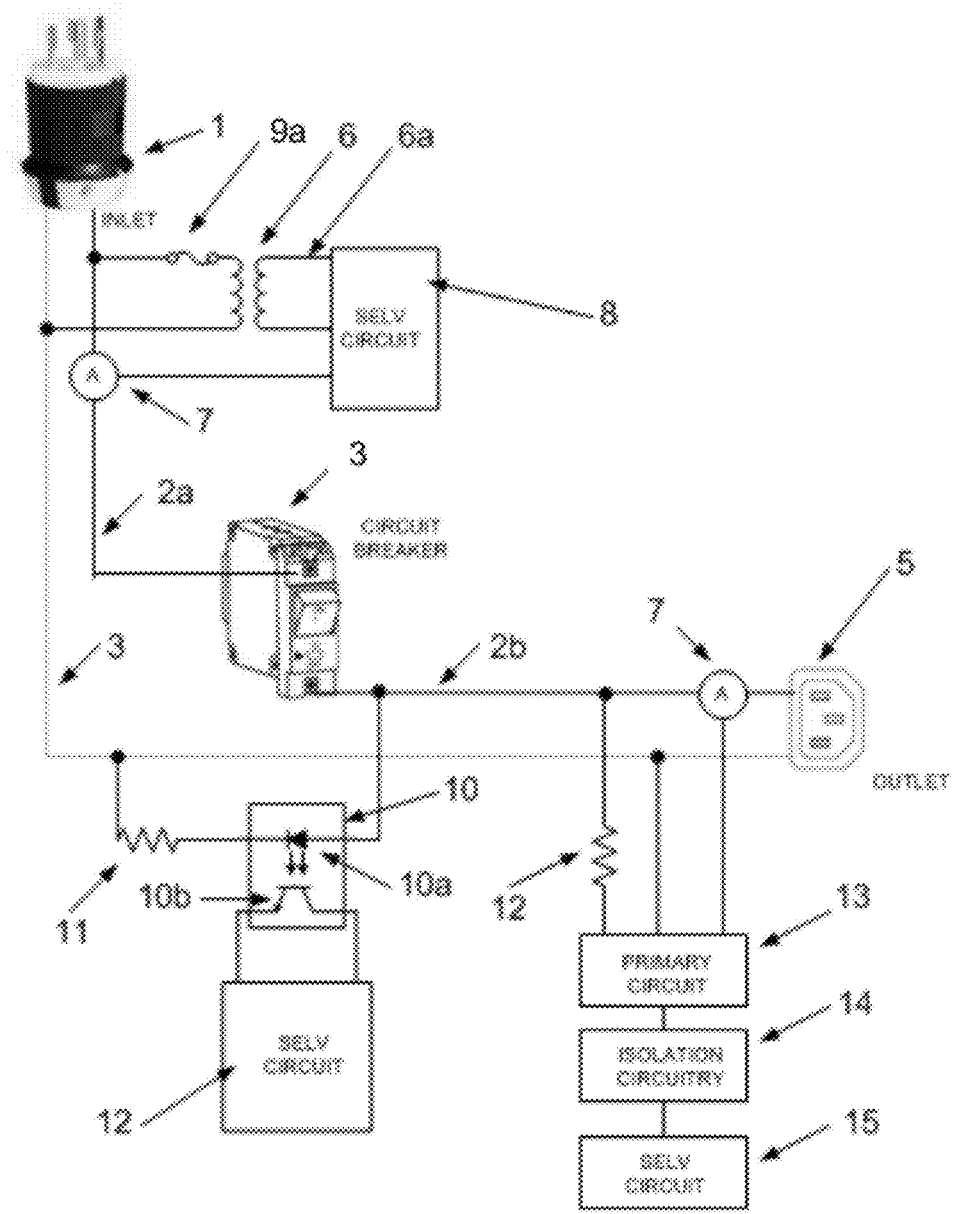
FIG. 2 schematically illustrates conventional voltage sensors that use transformers and opto-isolators in order to achieve primary to secondary isolation.

Voltage sensor (100a) is used in SELV circuits that measure voltage and power and eliminates the need for the conventional voltage sensors, such as step down transformers (6) and other isolated primary circuits shown in FIG. 2. Voltage sensor 100a has the advantages of being smaller, less costly and more accurate than conventional voltage sensors used to provide measured voltage to SELV circuits. The components of the voltage sensor 100a may include small surface mount resistors and (optionally) one small surface mount capacitor. Thus, the total cost for the voltage sensor (100a) may be less than about $0.10 in parts. The sensor is extremely accurate and exhibits precise amplitude and phase response.

Voltage sensor 100a is a voltage divider including a series resistance network (103), shunt resistance (104) (only one resistor required in this embodiment), and an optional shunt capacitance, which may be implemented using a single capacitor (105). The shunt capacitor (105) is only required when the SELV circuit (109) requires its input to be frequency limited by a low pass filter.

Series resistance (103) is made up of a plurality of resistors. In this embodiment, which is intended to meet the requirements of UL 60950-1 (and the specific line-ground voltage characteristics of the source), seven identical 1.5 megohm, 800 working volt resistors are employed to implement the series resistance (103). However, it is understood that the exact number of resistors, their resistance values, and voltage ratings may vary providing they satisfy the requirements of the given safety standard, in this case UL 60950-1. Series resistance (103) connects to the primary side on one end (1a), and connects to the SELV (109) of the secondary side on the other end (108).

A resistance connecting the primary side to the SELV (109) is permitted in UL 60950-1 providing it meets certain requirements. Series resistance (103) satisfies UL 60950-1 as follows: (1) the component resistors of the series resistance (103) are mounted on a printed circuit board (not shown) where the distance between components meets UL 60950-1 clearance and spacing values; (2) when any one of the component resistors of the series resistance (103) fails due to an open or short circuit, the current flow from the primary side (1a) to the output (108), which is input to the SELV circuit (109) is less than 700 microamperes peak; and (3) the breakdown voltage of series resistance (103) is 5600V—the sum of the working voltages of the seven component resistors wired in series. This breakdown voltage satisfies the electric strength test (hipot) requirement of UL 60950-1 section 5.2.

Shunt resistor (104) reduces the primary voltage so that it does not exceed the 42.4V peak maximum specified in UL 60950-1 section 2.2. The voltage reduction uses the well known voltage divider formula: ratio=shunt/(shunt+series). A preferred value of 7.87 k for resistor (104) results in a ratio of 0.000749, which reduces a 250V AC primary voltage (1a) down to a 0.187 volt AC signal on output (108), which is suitable for the Analog Devices ADE 7878 Energy Metering IC, which as discussed above may be used to implement the SELV circuit (109).

The shunt capacitor (105) implements an inexpensive first order low pass anti-alias filter for the SELV circuit (109), which requires its voltage inputs to be frequency band limited. The 3 dB cut off frequency of the low pass filter occurs when the magnitude of the capacitor's impedance equals the resistance of the shunt resistor (104) using the well known capacitor impedance formula: $Z=1/(2\pi*frequency*capacitance)$. Thus, for the 7.87k shunt resistance (104) and a 4 nanofarad capacitance (105), the 3 dB cut off frequency is approximately 5 kHz, which is suitable for use with the Analog Devices ADE 7878 Energy Metering IC (109).

Figure 4:
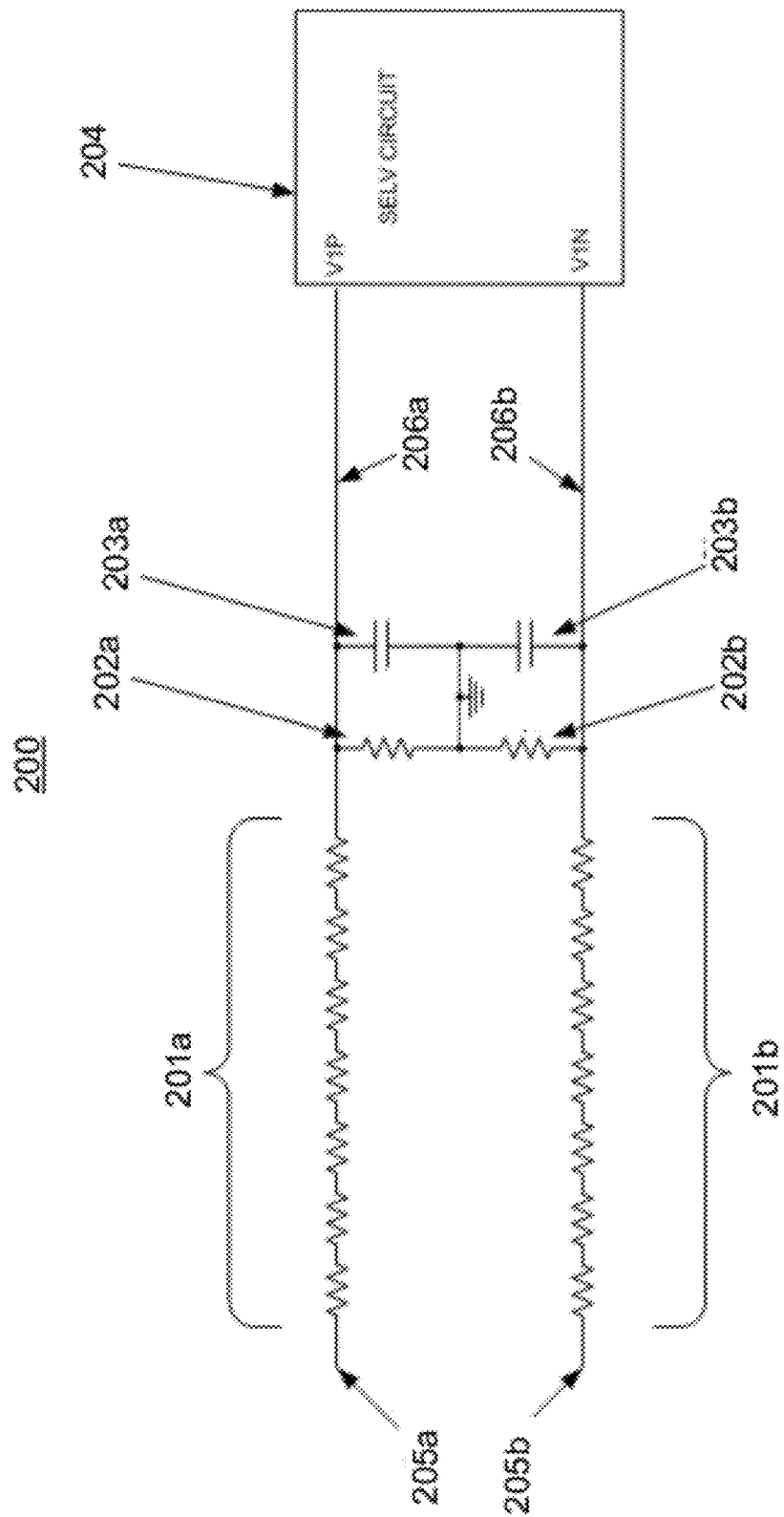
FIG. 4 schematically illustrates a preferred embodiment of the invention for a voltage sensor with a differential primary side sensed input and a differential output for connection to a secondary side circuit.

FIG. 4 illustrates a preferred embodiment of the invention as implemented in a system (200) including a voltage sensor that performs a differential measurement across two primary side AC mains lines (205a, 205b) and outputs a scaled down differential AC voltage output (206a, 206b) for connection to a secondary side SELV circuit (204). A differential output sensor is useful with SELV circuits (204) that incorporate differential input analog to digital converters. For example, the SELV circuit (204) may be implemented using the Analog Devices ADE 7763 energy meter integrated circuit. This type of sensor is used in SELV circuits that measure voltage and power and avoids the need for conventional voltage sensors, such as the step down transformers and isolated primary circuits shown in FIG. 2.

This voltage sensor has the advantages of being smaller, less costly and more accurate than conventional voltage sensors used in such applications where isolation is required or desired. The components of the system 200 preferably include a plurality of small, surface mount resistors (201a, 201b, 202a, and 202b) and (optionally) a plurality of small, surface mount capacitors (203a, 203b). The total part cost for components shown is less than about $0.20. The voltage sensor is extremely accurate and exhibits precise amplitude and phase response.

The voltage sensor includes two identical voltage dividers, where each divider contains a series resistance (201a and 201b), a shunt resistance (202a and 202b), and a shunt capacitance (203a and 203b). The shunt capacitance, which in this case is implemented as a single capacitor (203a and 203b) in each voltage divider, are only required when the SELV circuit (204) requires its input to be frequency limited by a low pass filter.

Series resistors (201a and 201b) are each made up of a plurality of series-coupled resistors, for example seven identical 1.5 megohm, 800 working volt resistors. Again, although the exact number of resistors, their values and voltage ratings may vary, the combination should satisfy the requirements of the particular safety standard at issue, in this example, UL 60950-1.

Each series resistance (201a and 201b) satisfies UL 60950-1 as follows: (1) the component resistors of each series resistance are mounted on a printed circuit board (not shown) where the distance between components meets UL 60950-1 clearance and spacing values; (2) when any one of the component resistors of either series resistance (201a and 201b) fails due to an open or short circuit, the current flow from the primary side (205a and 205b) to the outputs (206a, 206b), which are input to the SELV circuit (204) is less than 700 microamperes peak; and (3) the breakdown voltage of each series resistance (201a, 201b) is 5600V—the sum of the working voltages of the series-coupled component resistors in each resistance (201a, 201b). This breakdown voltage satisfies the electric strength test (hipot) requirement of UL 60950-1 section 5.2.

Shunt resistors (202a and 202b) reduce the primary voltage so that it does not exceed the 42.4V peak maximum specified in UL 60950-1 section 2.2. The voltage reduction uses the well known voltage divider formula: ratio=shunt/(shunt+series). The preferred values of 7.87 k for resistors (202a, 202b) results in a ratio of 0.000749 which will reduce a 250V AC primary voltage (205a and 205b) down to a 0.187 volt AC signal on either of lines (206a and 206b), which is suitable for the Analog Devices ADE 7763 Energy Metering IC SELV circuit (204).

The shunt capacitors (203a and 203b) implement an inexpensive first order low pass anti-alias filter for SELV circuits that require their inputs to be frequency band limited. The −3 dB cut off frequency of the low pass filter occurs when the impendence magnitude of the capacitor equals the resistance of the shunt resistor (202a or 202b) using the well known impedance formula for capacitors: $f=1/(2\pi*frequency*capacitance)$. For the 7.87 k shunt resistance (202a and 202b) and a 4 nanoFarad capacitance (203a and 203b), the −3 dB cut off frequency is approximately 5 kHz which is suitable for use with the Analog Devices ADE 7763 Energy Metering IC (204).

Figure 5:
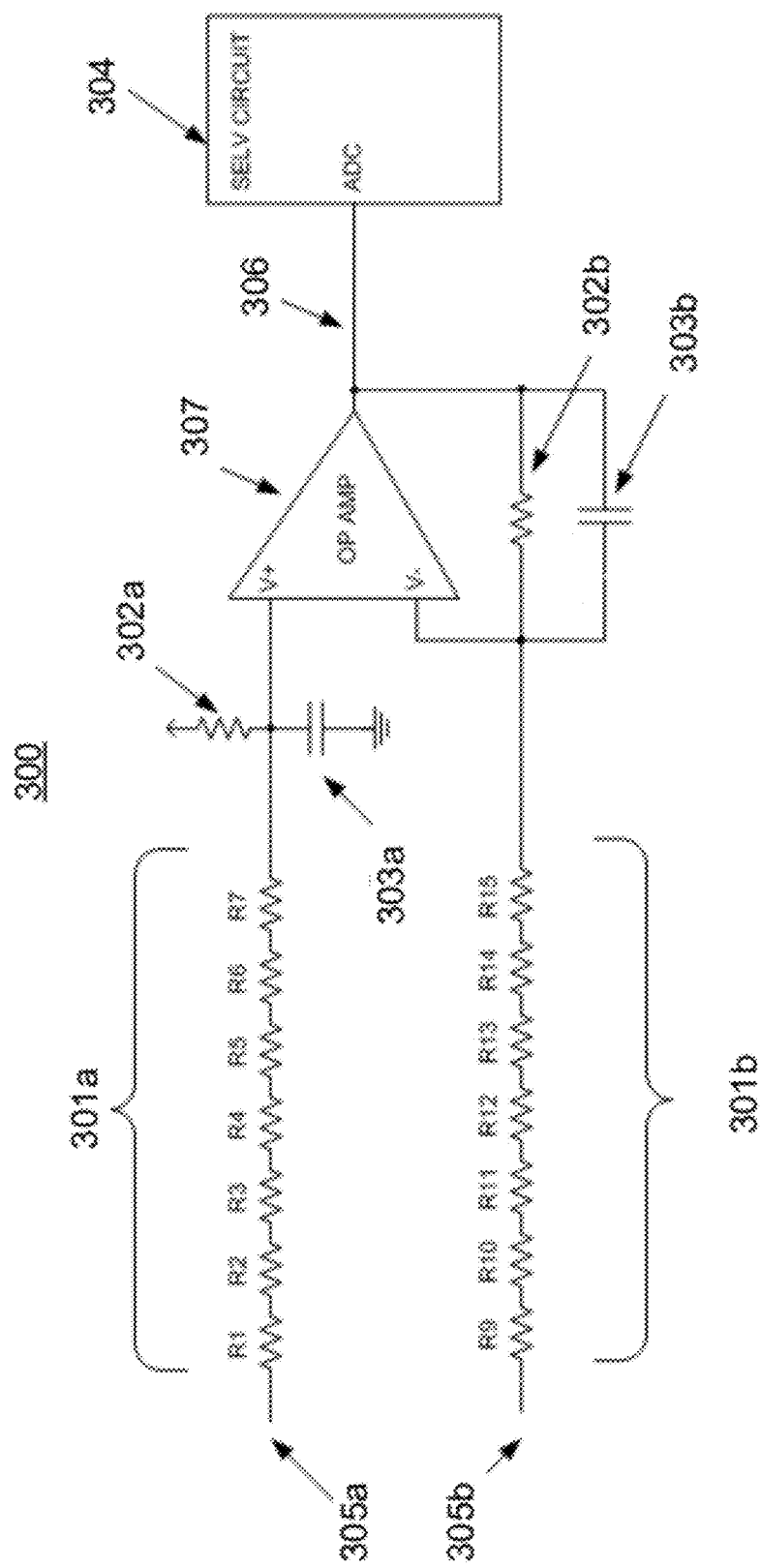
FIG. 5 schematically illustrates a preferred embodiment of the invention for a voltage sensor with a differential primary side sensed input and single ended output for connection to a secondary side circuit.

FIG. 5 illustrates a preferred embodiment of the invention as implemented in a system 300 including a voltage sensor that performs a differential measurement across two primary side AC mains lines (305a, 305b) and outputs a scaled down AC voltage single ended output on line (306) for input to a SELVE circuit (304). A single ended output sensor is useful with SELV circuits (304) that incorporate single ended input analog to digital converters. By way of example, the SELV circuit 304 may be implemented using a general purpose microprocessor, like the ST Microelectronics STM32 microcontroller integrated circuit.

This type of sensor is used in SELV circuits that measure voltage and power, and avoids the need for conventional voltage sensors, such as step down transformers and isolated primary circuits shown in FIG. 2. This sensor has the advantages of being smaller, less costly and more accurate than conventional voltage sensors used to provide measured voltages across isolation boundaries. The components of the voltage sensor includes a plurality small, surface mount resistors (301a, 301b, 302a, 302b), a general purpose operational amplifier (307), and (optionally) a plurality of small, surface mount capacitors (303a, 303b). The total parts cost for these components is less than about $0.45. The sensor is extremely accurate and exhibits precise amplitude and phase response.

The voltage sensor preferably includes two identical voltage dividers where each divider contains a series resistance (301a and 301b), a shunt resistance (302a and 302b), and an (optional) shunt capacitance (303a and 303b).

Series resistances (301a and 301b) are each made up of a plurality of series-coupled resistors. By way of example, each series resistance (301a and 301b) may include seven identical 1.5 megohm, 800 working volt resistors. Again, although the exact number of resistors, their values and voltage ratings may vary, they are intended to satisfy the requirements of the particular safety standard at issue, in this case UL 60950-1. Series resistances (301a and 301b) each satisfy UL 60950-1 as follows: (1) the component resistors of each series resistance are mounted on a printed circuit board (not shown) where the distance between components meets UL 60950-1 clearance and spacing values; (2) when any one of the component resistors of either series resistance (301a and 301b) fails due to an open or short circuit, the current flow from the primary side (305a and 305b) to the output (306), which is input to the SELV circuit (304) is less than 700 microamperes peak; and (3) the breakdown voltage of each series resistance (301a, 301b) is 5600V—the sum of the working voltages of the series-coupled component resistors in each resistance (301a, 301b). This breakdown voltage satisfies the electric strength test (hipot) requirement of UL 60950-1 section 5.2.

Shunt resistances (302a and 302b), which are implemented in this example by respective, single resistors, reduce the primary voltage so that it does not exceed the 42.4V peak maximum specified in UL 60950-1 section 2.2. The shunt capacitance (303a and 303b), which are implemented in this example by respective, single capacitors, result in an inexpensive first order low pass anti-alias filter for SELV circuits that require their inputs to be frequency band limited. The −3 dB cut off frequency of the low pass filter occurs when the impendence of a given capacitor (303a, 303b) equals that of the respective shunt resistor (302a or 302b) using the well known impedance formula for capacitors: $Z=1/(2\pi*frequency*capacitance)$. For a 47 k shunt resistance for each resistor (302a and 302b), and 680 picofarad capacitance for each capacitor (303a and 303b), the −3 dB cut off frequency is approximately 5 kHz, which is suitable for use with the STM32 MCU analog to digital converter (304).

The operational amplifier (307) incorporates the two voltage dividers into a differential amplifier topology. Since the values of the series resistances (301a, 301b) are identical and the values of the shunt resistances (302a, 302b) are identical, the output of the operational amplifier (307) adheres to the well known differential operational amplifier gain formula: output=input*shunt/(shunt+series). For preferred values of 1.5 megohm for each resistor of resistances (301a, 301b), and 47 k for each resistance (302a, 302b), the ratio equals 0.0045, which will reduce a 250V AC primary voltage differential across lines (305a, 305b) down to a 1.1 volt AC signal on line (306), which is suitable for an STM32 microcontroller single ended SELV circuit (304).

Figure 6:
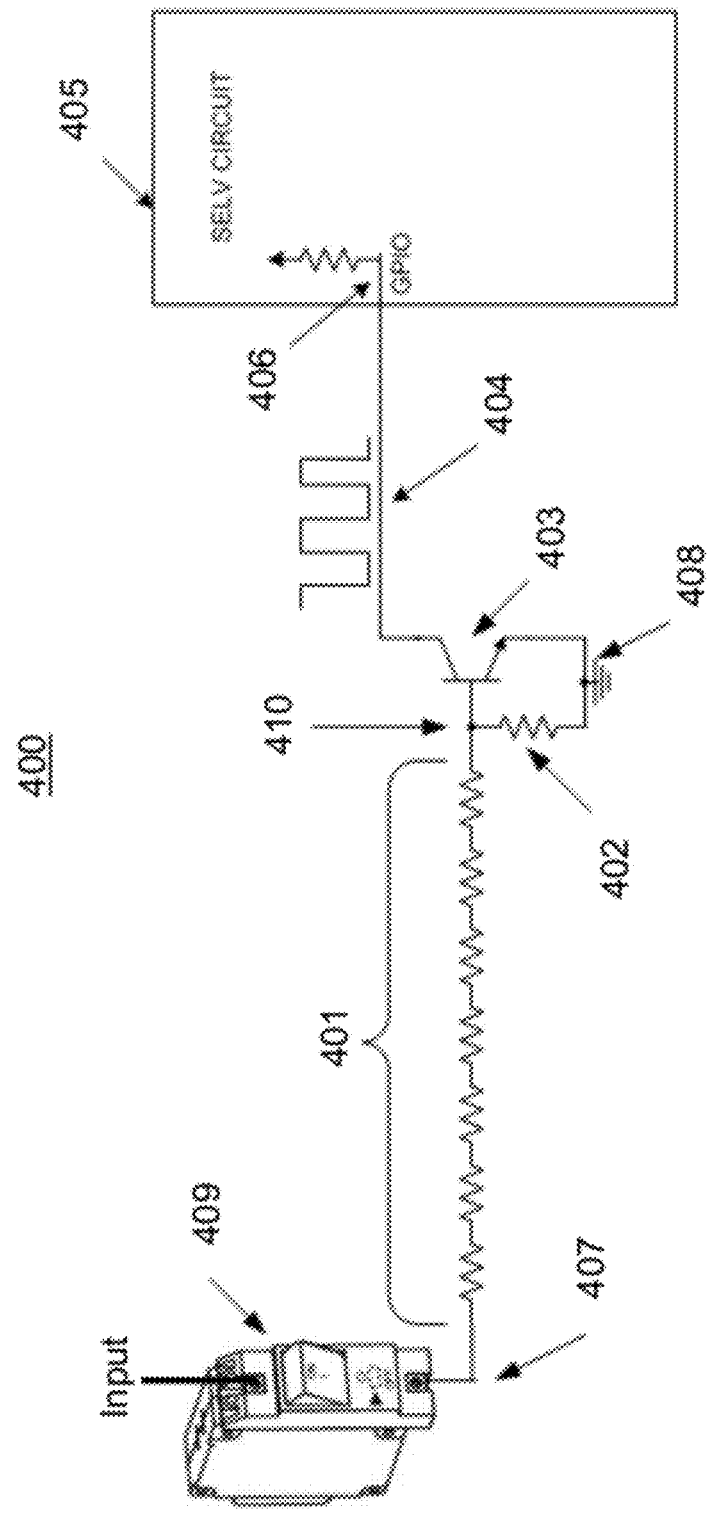
FIG. 6 schematically illustrates a preferred embodiment of the invention for a voltage sensor to sense the presence or absence of AC voltage via a single ended sensed input on a primary side and a pulse wave output for connection to a secondary side circuit.

FIG. 6 illustrates a preferred embodiment of the invention implemented in a system 400 including a voltage sensor that senses the presence or absence of AC voltage by performing a single ended measurement between a primary side AC main line (407) and ground (408) and produces a pulse wave output (404) for input to a secondary side circuit, such as a SELV circuit 405, when the AC voltage is above a prescribed amplitude threshold. This type of voltage sensor is used in SELV circuits that detect the presence or absence of primary AC voltage, such as blown fuses, tripped circuit breakers or any other type of on/off switched AC voltage.

This voltage sensor of the system 400 has the advantages of being smaller, less costly and using less power than conventional voltage sensors, such as the optical isolator (10) shown in FIG. 2. The components of the system 400 include a plurality of small, surface mount resistors (401, 402), and one or more transistors (403), in this example, one transistor. The total cost for the voltage sensor is less than about $0.10. The sensor draws approximately 5 milliWatts of power from the primary AC power line, which is much less than the 230 milliWatts typically required for the optical isolator (10).

The voltage sensor includes a voltage divider, comprising a series resistance (401) and shunt resistance (402). The series resistance (401) is preferably made up of a plurality of series-coupled resistors, such as seven identical 1.5 megohm, 800 working volt resistors. Again, although the exact number of resistors, their values and voltage ratings may vary from application to application, the result is intended to satisfy the requirements of applicable safety standard, such as the UL 60950-1. The series resistance (401) connects to the primary side on one end (407), and to the secondary side on the other end (410), which is coupled to the SELV circuit (405). A resistive network connecting a primary side to a secondary side SELV circuit, across an isolation boundary, is permitted in UL 60950-1, providing it meets certain requirements. The resistance (401) satisfies UL 60950-1 as follows: (1) the component resistors of the series resistance (401) are mounted on a printed circuit board (not shown) where the distance between components meets UL 60950-1 clearance and spacing values; (2) when any one of the component resistors of the series resistance (401) fails due to an open or short circuit, the current flow from the primary side (407) to the output (404), which is input to the SELV circuit (405) is less than 700 microamperes peak; and (3) the breakdown voltage of series resistance (401) is 5600V—the sum of the working voltages of the seven component resistors wired in series.

Shunt resistance (402), which in this case is implemented with a single resistor, reduces the primary voltage so that it does not exceed the 42.4V peak maximum specified in UL 60950-1 section 2.2. The voltage reduction uses the well known voltage divider formula: ratio=shunt/(shunt+series). For preferred values of 1.5 megohm for each resistor of series resistance (401), and 100 k for resistance (402), the ratio equals 0.0095, which will reduce a 250V AC primary voltage (407) down to a 2.38 volt AC signal on node (410).

The base of bipolar transistor (403) is wired to the voltage divider output (410), and the bipolar transistor (403) turns on when the voltage divider output is greater than about 0.6 volts. The ratio of the series and shunt resistances (401, 402) is chosen such that any primary AC voltage (407) greater than about 70 volts will produce an output voltage (410) greater than the 0.6 volts required to turn on the transistor (403). When the circuit breaker (409) is closed and in the normal operating state, the transistor (403) turns on and off once every primary AC voltage cycle. When the circuit breaker (409) is open ("tripped"), no primary AC voltage is present at its output (407) and the bipolar transistor (403) remains turned off.

The output of the transistor (403) is connected to a general purpose input/output (GPIO) pin (406) of a microprocessor, such as an ST Microsystems STM32, which is suitable to implement the SELV (405). The general purpose microprocessor is programmed with an algorithm to detect the presence or absence of a pulse wave (404) on the GPIO input pin (406). Presence of the pulse wave (404) is interpreted as circuit breaker closed. Absence of the pulse wave (404) is interpreted as circuit breaker open ("tripped").

Figure 7:
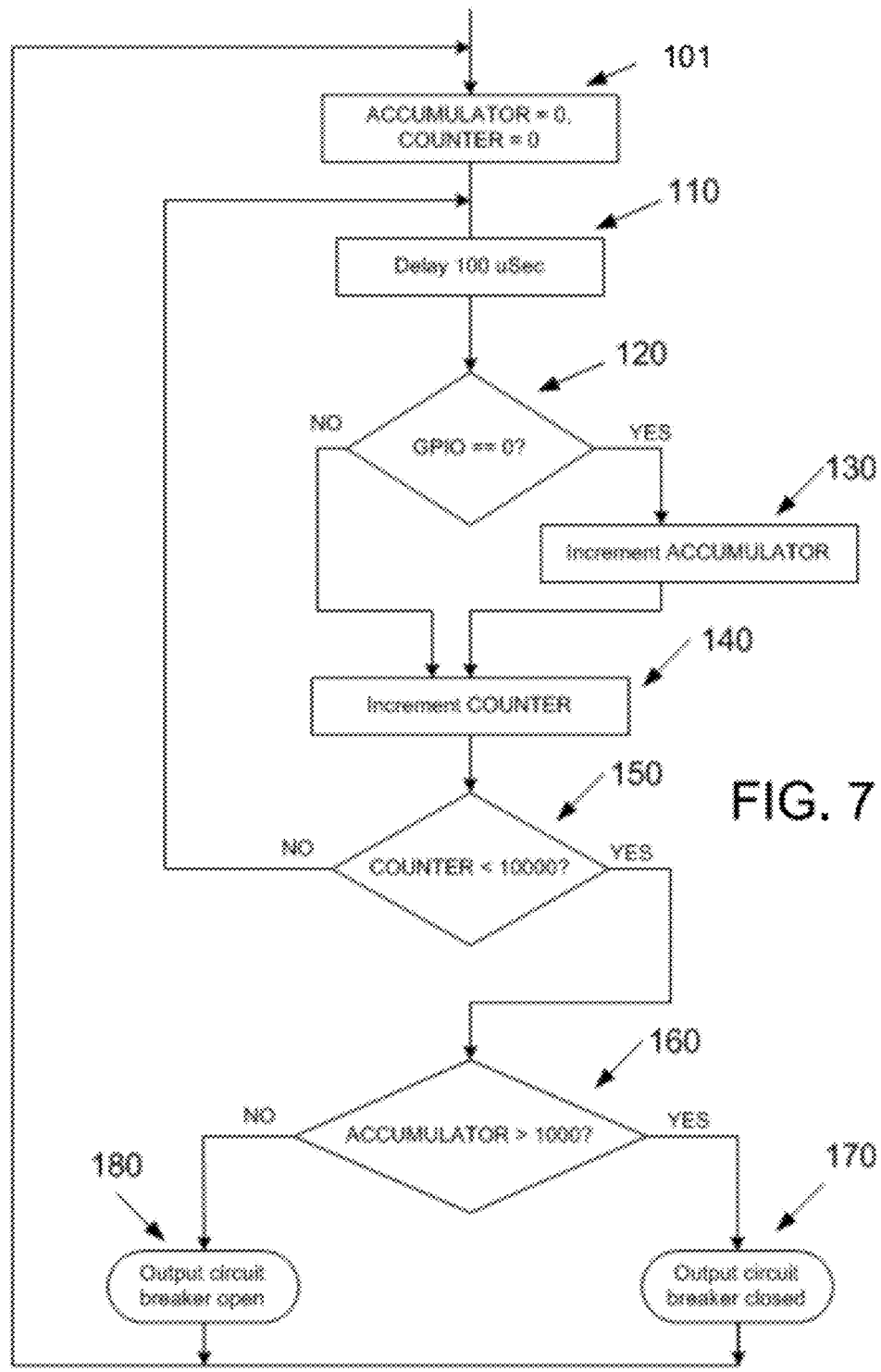
FIG. 7 is a flow chart showing the operation of the embodiment of FIG. 6.

A preferred microprocessor algorithm to determine whether the circuit breaker (409) in FIG. 6 is open or closed is shown as a flowchart in FIG. 7. The programming steps in the algorithm are carried out over a measurement period, e.g., about one second long, and immediately repeated once a measurement has been concluded. In first step 101, an accumulator register and a counter register are set to zero. The algorithm then pauses for 100 microSeconds in step 110. The algorithm then checks the logic state of the GPIO pin in step 120. If the GPIO pin is a logical "0", which indicates the presence of a pulse wave, the accumulator is incremented in step 130. If the GPIO pin is a logical "1" which indicates the absence of a pulse wave, the accumulator is not incremented. The algorithm then increments the counter (step 140) and the value of the counter is checked in step 150. If the counter is less than 10,000, the algorithm repeats from step 110. If the counter is equal to 10,000 it indicates that 10,000 checks of the GPIO pin have been performed over a one second period and the algorithm proceeds to check the value of the accumulator in step 160. If the value of the accumulator is greater than 1,000, it indicates the presence of a pulse wave on the GPIO pin with a duty cycle of at least 10 percent and the algorithm outputs a "circuit breaker closed" indication in step 170. If the value of the accumulator is less than 1,000, it indicates absence of a pulse wave of the GPIO pin and the algorithm outputs a "circuit breaker open" indication in step 180.

The algorithm shown in FIG. 7 is robust and immune to noise present on the primary AC voltage because it uses a decision algorithm based on 10,000 measurements over a one second time period.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
a primary side circuit including one or more voltage nodes;
a secondary side circuit including at least one processing circuit; and
a resistor network having an input for receiving a first sensed voltage from a first of the one or more voltage nodes of the primary side circuit, traversing an isolation boundary between the primary side circuit and the secondary side circuit while adhering to a safety specification which includes a primary-secondary isolation requirement, and having an output for providing a first modified sensed voltage to the processing circuit;
wherein the resistor network includes:
a plurality of series-coupled resistors, which are connected at one end to the first voltage node of the primary side circuit, and are connected at an opposite end to a junction node; a shunt resistance coupled from the junction node to a reference potential;
the output providing the first modified sensed voltage to the processing circuit is at least one of taken from, and derived from, a voltage at the junction node;
wherein:
the first voltage node of the primary side circuit exhibits a single ended alternating current (AC) voltage potential with respect to the reference potential;
the apparatus further includes a switching circuit including an input terminal coupled to the junction node and an output terminal, which pulses in response to the AC potential at the input terminal; and
the output providing the first modified sensed voltage to the processing circuit is a single ended pulsed voltage taken from the output terminal of the switching circuit with respect to the reference potential.

2. The apparatus of claim 1, wherein:
the first voltage node of the primary side circuit exhibits a single ended voltage potential with respect to the reference potential; and the output providing the first modified sensed voltage to the processing circuit is a single ended voltage taken from the junction node with respect to the reference potential.

3. The apparatus of claim 1, wherein the single ended pulsed voltage indicates the presence or absence of the AC voltage potential of the primary side circuit.

4. The apparatus of claim 1, wherein:
the switching circuit includes a switching transistor having an input terminal and two output terminals; the input terminal of the switching transistor is the input terminal of the switching circuit; one of the output terminals of the switching transistor is held at a bias voltage potential; the single ended pulsed voltage is taken from the other of the output terminals of the switching transistor with respect to the reference potential.

5. The apparatus of claim 4, wherein the switching transistor is a bipolar junction transistor, having a base as an input terminal, an emitter coupled to the reference potential and a collector from which the single ended pulsed voltage is taken.

6. The apparatus of claim 1, wherein:
first and second voltage nodes of the primary side circuit produce a differential voltage;
the plurality of series-coupled resistors includes first and second pluralities of series-coupled resistors;
the first plurality of series-coupled resistors are connected at one end to the first voltage node of the primary side circuit, and are connected at an opposite end to a first junction node; and
the second plurality of series-coupled resistors are connected at one end to the second voltage node of the primary side circuit, and are connected at an opposite end to a second junction node.

7. The apparatus of claim 6, wherein:
the shunt resistance includes first and second resistances, the first resistance coupled from the first junction node to the reference potential, and the second resistance coupled from the second junction node to the reference potential; and
the output providing the first modified sensed voltage to the processing circuit is taken as a differential output between the first and second junction nodes.

8. The apparatus of claim 6, wherein:
the apparatus further comprises a differential to single ended conversion circuit having first and second input terminals and an output terminal;
the shunt resistance includes first and second resistances;
the first resistance is coupled from the first junction node to a first potential, and the first junction node is coupled to the first input terminal of the differential to single ended conversion circuit;
the second resistance is coupled from the second junction node to a second potential, and the second junction node is coupled to the second input terminal of the differential to single ended conversion circuit; and
the output providing the first modified sensed voltage to the processing circuit is taken as a single ended output at the output terminal of the differential to single ended conversion circuit with respect to the reference potential.

9. The apparatus of claim 1, wherein the one or more voltage nodes of the primary side circuit are coupled to a source of power and the monitoring circuit operates to monitor one or more parameters of the source of power.

10. The apparatus of claim 1, wherein the safety specification is the UL 60950-1.

11. The apparatus of claim 1, wherein the safety specification requires that at least one of:
isolation between the primary side circuit and the secondary side circuit;
when any of the resistors of the resistor network opens or shorts, any current flow from the primary side circuit to the secondary side circuit through the resistor network is less than a specified current threshold level;
any voltage potential on any node of the secondary side circuit may not exceed a specified voltage threshold level; and
when any of the resistors of the resistor network are subjected to a highest potential voltage anywhere in the primary side circuit, such resistors will not be damaged.

12. The apparatus of claim 11, wherein: the specified current threshold level is about 700 microamperes peak; and the specified voltage threshold level is about 42.4 V peak.

13. An apparatus, comprising:
a primary side circuit including one or more voltage nodes;
a secondary side circuit including at least one processing circuit;
a resistor network having an input for receiving a first sensed voltage from a first of the one or more voltage nodes of the primary side circuit, traversing an isolation boundary between the primary side circuit and the secondary side circuit while adhering to a safety specification which includes a primary-secondary isolation requirement, and having an output for providing a first modified sensed voltage to the processing circuit;
the resistor network including a plurality of series-coupled resistors, which are connected at one end to the first voltage node of the primary side circuit, and are connected at an opposite end to a junction node; a shunt resistance coupled from the junction node to a reference potential;
the output providing the first modified sensed voltage to the processing circuit is at least one of taken from, and derived from, a voltage at the junction node;
first and second voltage nodes of the primary side circuit producing a differential voltage;
the plurality of series-coupled resistors including first and second pluralities of series-coupled resistors;
the first plurality of series-coupled resistors being connected at one end to the first voltage node of the primary side circuit, and being connected at an opposite end to a first junction node;
the second plurality of series-coupled resistors are connected at one end to the second voltage node of the primary side circuit, and are connected at an opposite end to a second junction node;
a differential to single ended conversion circuit having first and second input terminals and an output terminal;
the shunt resistance including first and second resistances;
the first resistance being coupled from the first junction node to a first potential, and the first junction node being coupled to the first input terminal of the differential to single ended conversion circuit;
the second resistance being coupled from the second junction node to a second potential, and the second junction node being coupled to the second input terminal of the differential to single ended conversion circuit;
the output providing the first modified sensed voltage to the processing circuit being taken as a single ended output at the output terminal of the differential to single ended conversion circuit with respect to the reference potential;

the differential to single ended conversion circuit comprises an operational amplifier having first and second input terminals and an output terminal, which are the first, second and output terminals of the differential to single ended conversion circuit, respectively;

the first potential is at a voltage potential above the reference potential;

the second resistance is coupled from the second junction node to the output terminal of the operational amplifier; and the single ended output is taken at the output of the operational amplifier with respect to the reference potential.

* * * * *